(12) United States Patent
Polnyi et al.

(10) Patent No.: US 7,261,570 B1
(45) Date of Patent: Aug. 28, 2007

(54) METHOD FOR ATTACHING CABLE TO CIRCUIT SUBSTRATE

(75) Inventors: Igor Polnyi, Aurora, IL (US); Hsiu-Yuan Hsu, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/489,421

(22) Filed: Jul. 19, 2006

(51) Int. Cl.
*H01R 12/00* (2006.01)
*H05K 1/00* (2006.01)

(52) U.S. Cl. .................................... 439/67
(58) Field of Classification Search .............. 439/67, 439/77, 493, 876
See application file for complete search history.

(56) References Cited

U.S. PATENT DOCUMENTS

| | | | |
|---|---|---|---|
| 5,009,605 A * | 4/1991 | Crumly et al. | 439/67 |
| 6,045,368 A * | 4/2000 | Cadenhead et al. | 439/67 |
| 6,280,205 B1 * | 8/2001 | Murowaki et al. | 439/79 |
| 6,783,371 B2 * | 8/2004 | Self et al. | 439/67 |
| 7,094,067 B2 * | 8/2006 | Kitagawa | 439/67 |

* cited by examiner

*Primary Examiner*—Javaid H. Nasri
(74) *Attorney, Agent, or Firm*—Wei Te Chung

(57) ABSTRACT

According to an embodiment of the present invention, a method for attaching a cable (30) to a circuit substrate (20) includes the steps of: (a) providing a circuit substrate having a number of conductive pads (202) arranged thereon in matrix; (b) providing a cable having a number of conductive balls (302) attached thereto in compliance with the conductive pads of the circuit substrate; and (c) securing the cable to the circuit substrate with the conductive balls thereof being securely and electrically registered with the corresponding conductive pads of the circuit substrate, respectively.

4 Claims, 6 Drawing Sheets

METHOD FOR ATTACHING CABLE TO CIRCUIT SUBSTRATE

BACKGROUND OF THE INVENTION

1. Field of the Invention

The present invention generally relates to the field of electrical connections. Particularly, an embodiment of the present invention relates to a method for attaching a cable, such as a flexible printed circuit and a flat flexible cable, to a circuit substrate.

2. General Background

Nowadays, cables, such as flexible printed circuits and flat flexible cables, are widely used in electronic applications to establish flexible electrical connection between various electronic components. Normally, a cable is attached to a circuit substrate via various electrical connectors. Typically, an electrical connector for attaching a cable to a circuit substrate has a dielectric housing and a number of conductive terminals residing in the dielectric housing. Each of the conductive terminals includes at least a spring arm to mate with a conductive pad at a terminating end of a circuit trace in the cable and a soldering arm to electrically mate with a soldering pad on the circuit substrate. In use, the cable is coupled to the electrical connector mounted on the circuit substrate with the help of an actuator. The spring arms and the soldering arms of the conductive terminals are brought to contact with the corresponding conductive pads on the cable and the soldering pads on the circuit substrate, respectively.

However, to establish desirable electrical connection between a cable and a circuit substrate, each conductive terminal of the electrical connector as described above must have a comparatively complicated configuration, which may possibly complicate the manufacturing process and lead to high manufacturing cost.

Therefore, there is a heretofore unaddressed need in the industry to address the aforementioned deficiencies and inadequacies.

SUMMARY

According to an embodiment of the present invention, a method for attaching a cable to a circuit substrate includes the steps of: (a) providing a circuit substrate having a number of conductive pads arranged thereon in matrix; (b) providing a cable having a number of conductive balls attached thereto in compliance with the conductive pads of the circuit substrate; and (c) securing the cable to the circuit substrate with the conductive balls thereof being securely and electrically registered with the corresponding conductive pads of the circuit substrate, respectively.

The embodiment of the present invention provides a considerably simple way to attach a cable to a circuit substrate, which may simplify the manufacturing process and facilitate assembly and disassembly of the cable.

The present invention is illustrated by way of example and not limitation in the figures of the appended drawings, in which like references indicate identical elements, and in which:

DETAILED DESCRIPTION OF THE EMBODIMENTS

In the following description, for purpose of explanation, numerous details are set forth in order to provide a thorough understanding of the embodiments of the present invention. However, it will be apparent to one skilled in the art that these specific details are not required in order to practice the embodiments of the present invention.

The following description includes terms such as inner, upper, bottom and the like, that are used for descriptive purpose only and are not to be construed as limiting. That is, these terms are terms that are relative only to a point of reference and are not meant to be interpreted as limitation but instead, are included in the following description to facilitate understanding of various aspects of the present invention.

Figure 1:
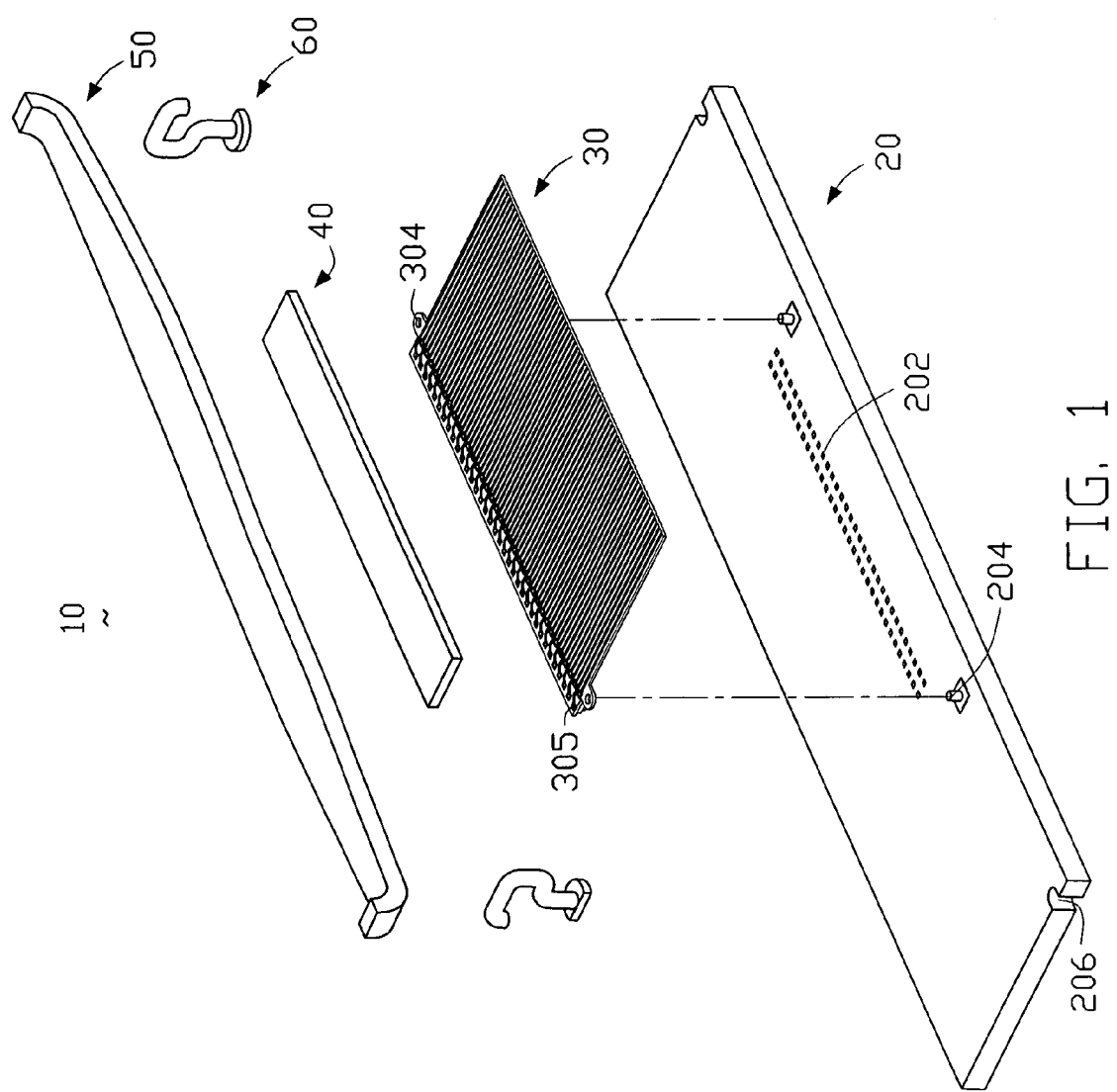
FIG. 1 illustrates an exemplary exploded view of an electrical connection in accordance with an embodiment of the present invention.

As illustrated in FIG. 1, an electrical connection 10 in accordance with an embodiment of the present invention includes a circuit substrate 20 having a number of conductive pads 202 arranged thereon in matrix, a cable 30, such as a flat flexible cable and a flexible printed circuit, having a number of conductive balls 302 attached thereto in compliance with the conductive pads 202 positioned on the circuit substrate 20, an electrically insulating slat 40 seated on an upper surface of the cable 30, and an elastic spring 50 and a pair of hooks 60 adapted to secure the cable 30 onto the circuit substrate 20.

Individual elements of the electrical connection 10 will now be described in greater detail. As illustrated in FIG. 1, the circuit substrate 20 is provided with a number of conductive pads 202 thereon in a matrix fashion. A pair of posts 204 extending largely vertically with respect to an upper surface of the circuit substrate 20 is disposed around the conductive pads 202 to ensure accurate and convenient positioning of the cable 30 on the circuit substrate 20. A pair of notches 206 extending throughout the circuit substrate 20 is defined at two opposite edges of the circuit substrate 20, to receive corresponding hooks 60 therein, respectively.

Figure 2:
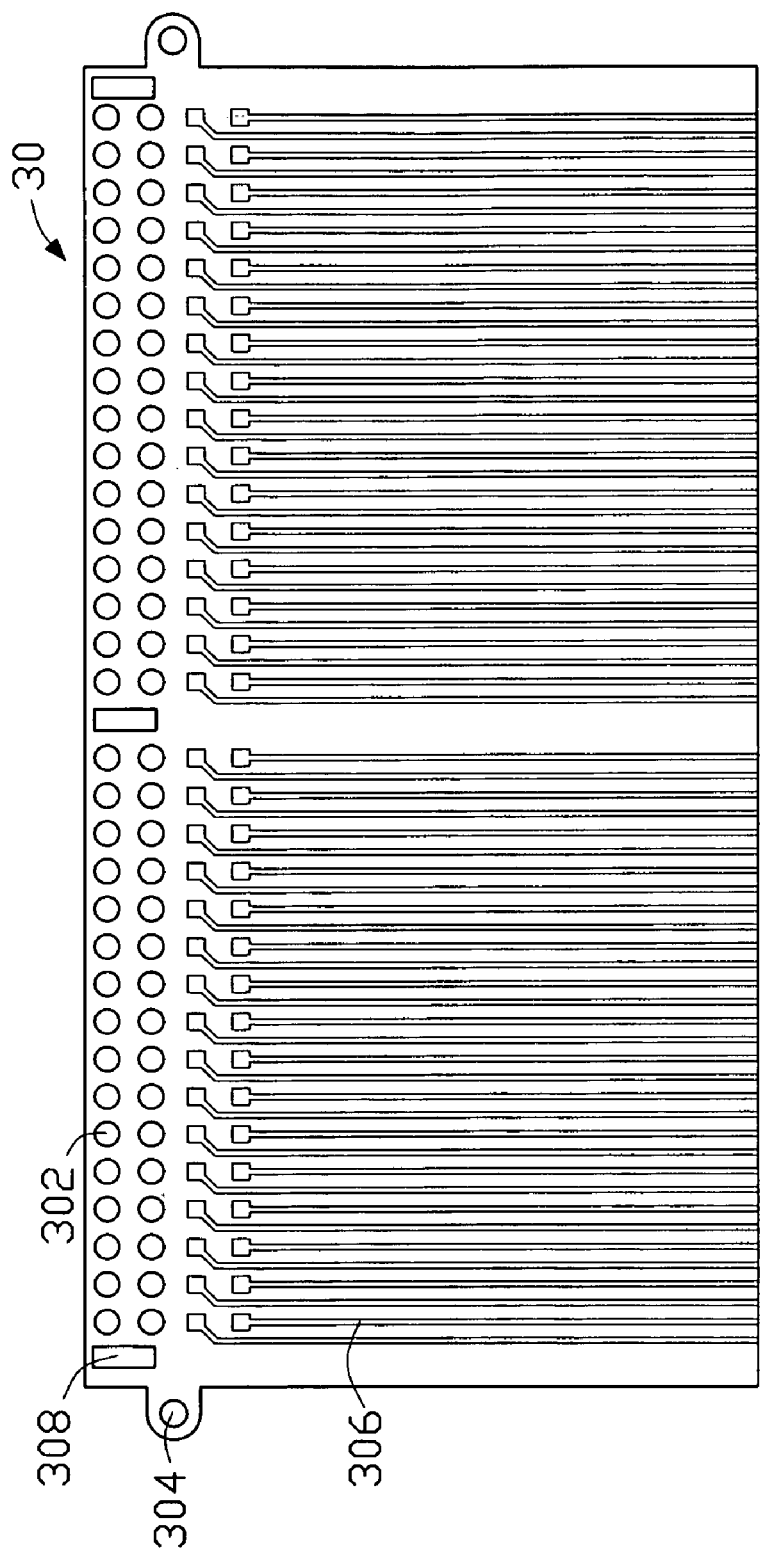
FIG. 2 illustrates an exemplary bottom view of a cable with conductive balls attached thereto of FIG. 1.
Figure 3:
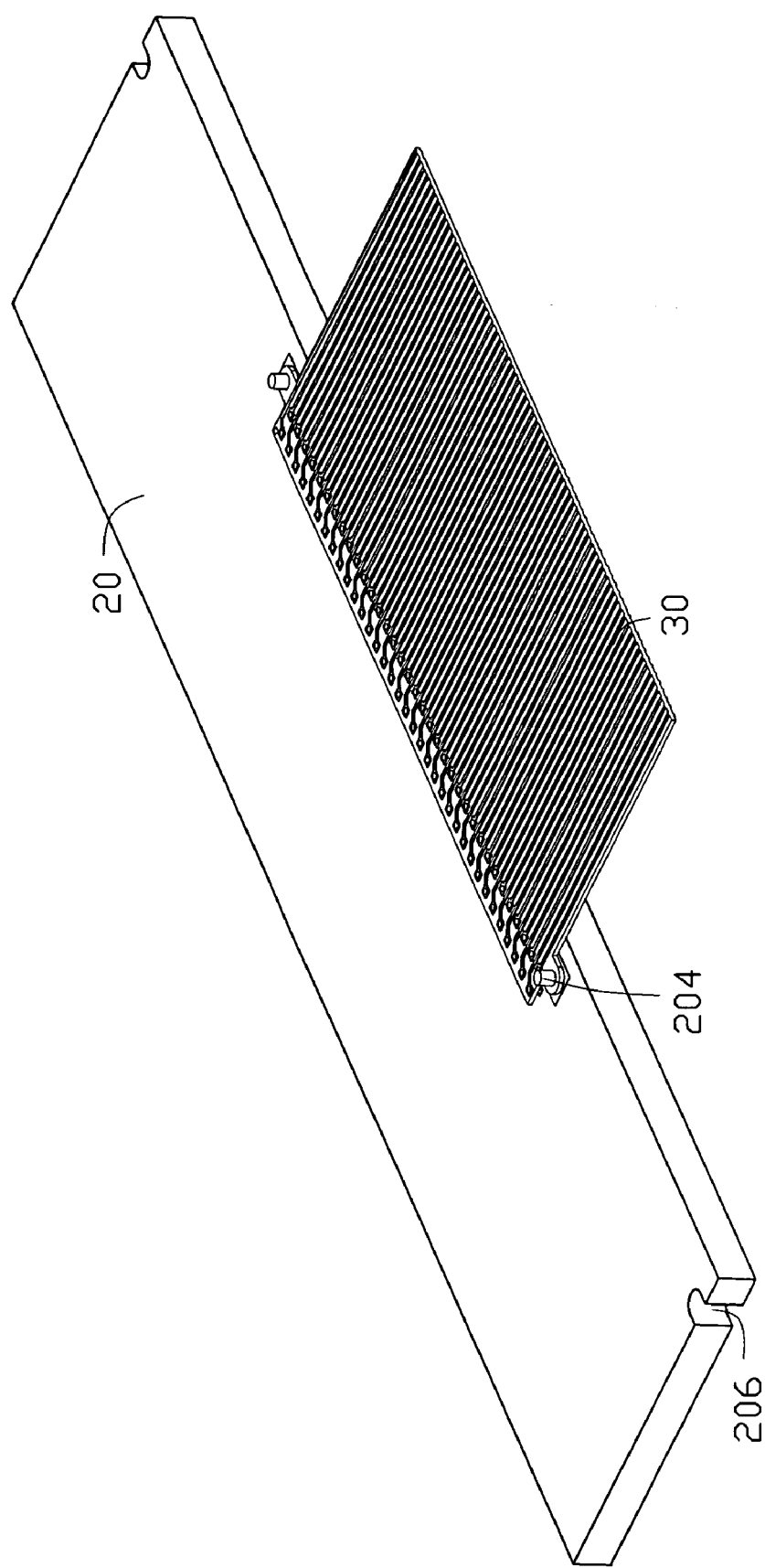
FIG. 3 illustrates an exemplary pre-assembled view of the electrical connection of FIG. 1, showing a cable being positioned on a circuit substrate.
Figure 4:
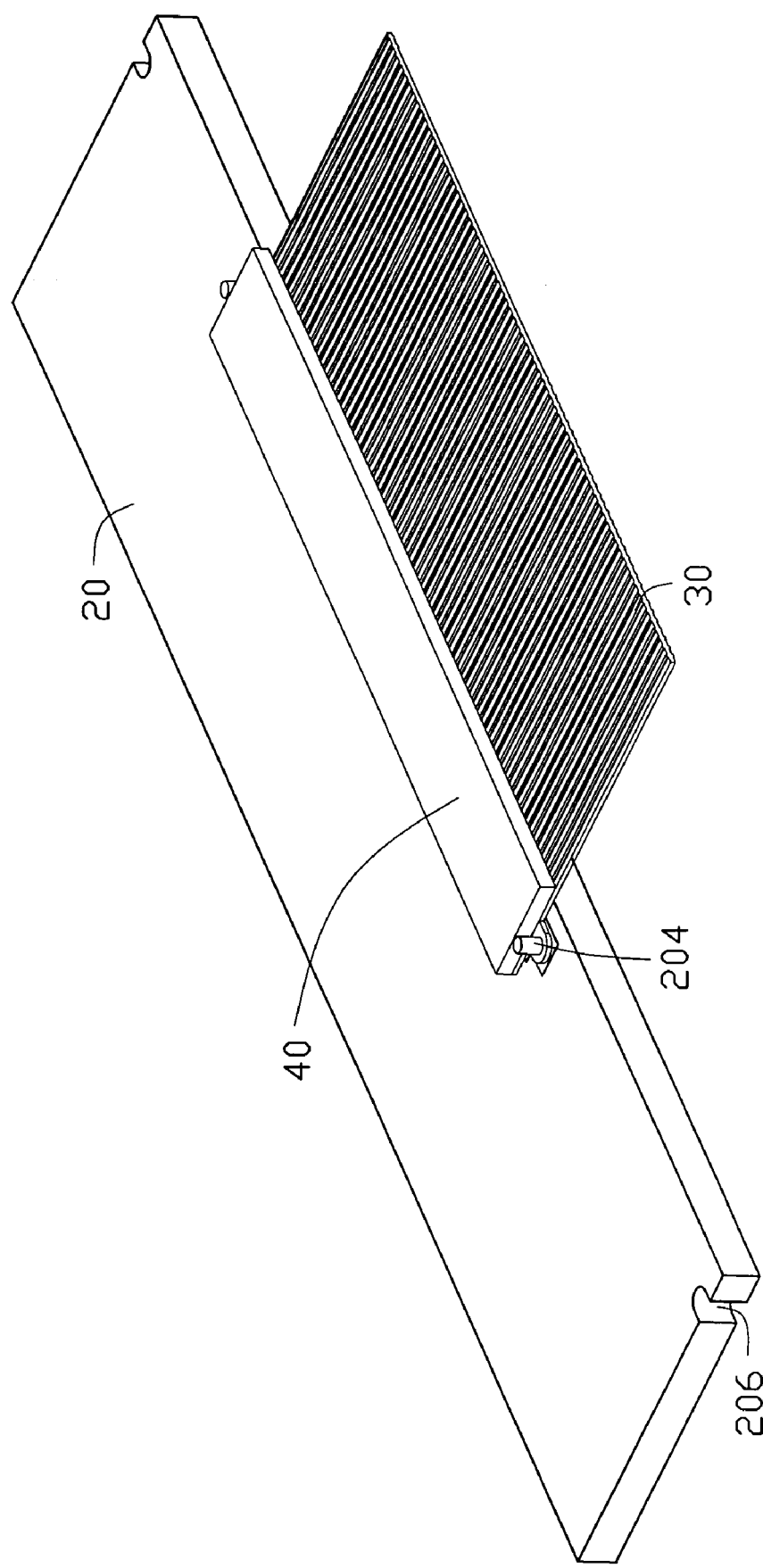
FIG. 4 illustrates an exemplary pre-assembled view of the electrical connection of FIG. 1, showing an electrically insulating slat being seated on the cable.
Figure 5:
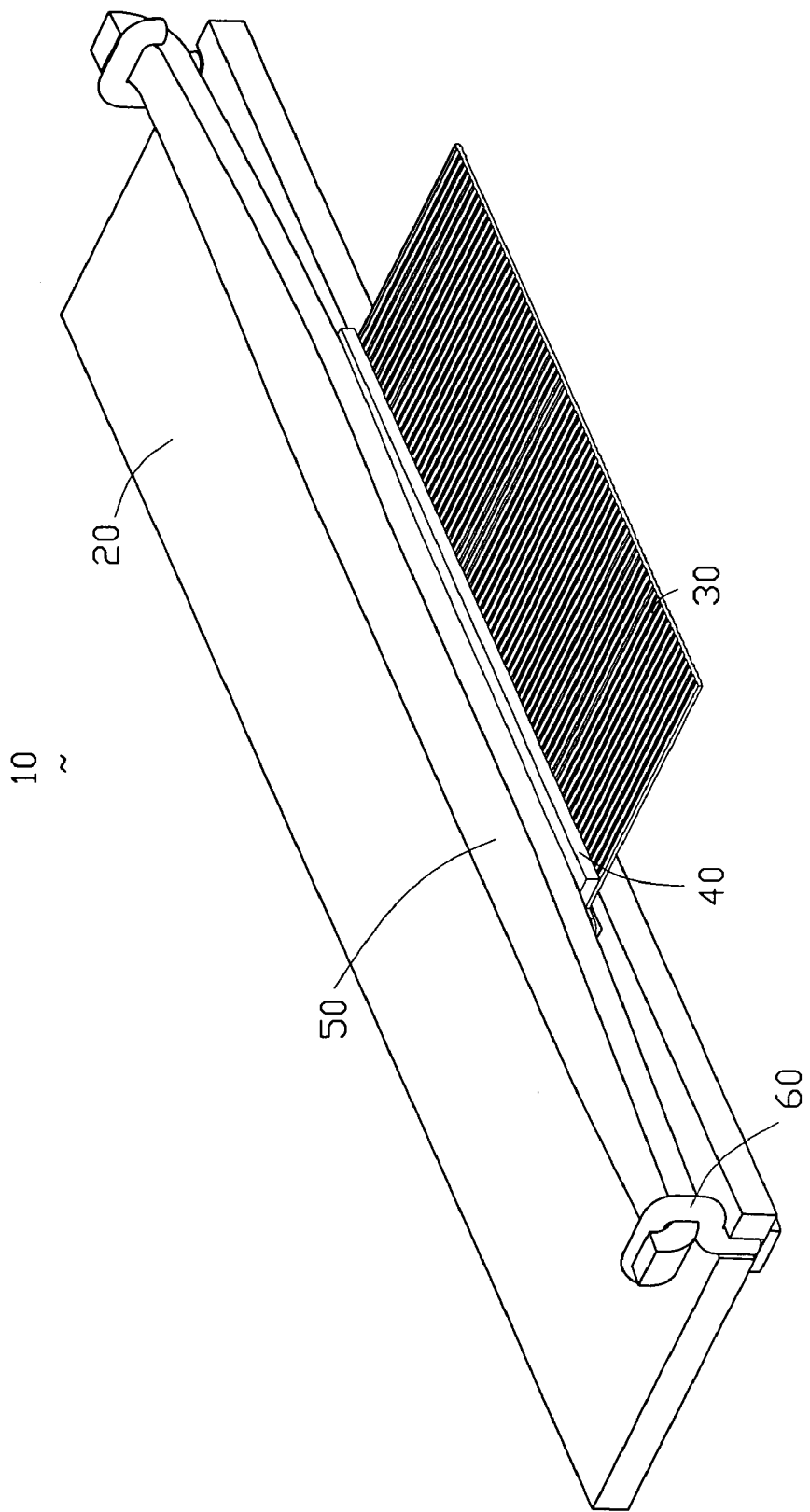
FIG. 5 illustrates an exemplary assembled view of the electrical connection of FIG. 1.
Figure 6:
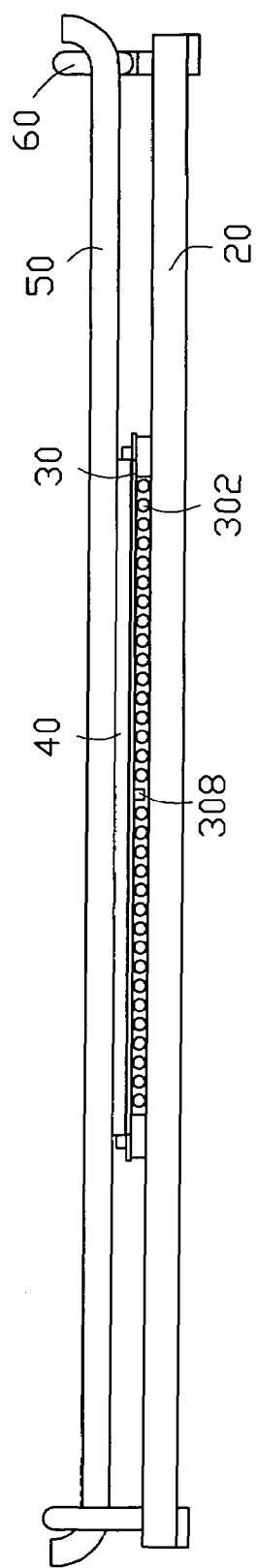
FIG. 6 illustrates an exemplary side view of the electrical connection of FIG. 5.

As illustrated in FIG. 2, the cable 30 includes a number of conductive balls 302 attached thereto at terminating ends of circuit traces 306 embedded therein. Each of the circuit traces 306 is covered with an electrically insulating jacket and formed with an exposed portion 305 at a terminating end thereof. The conductive balls 302 are arranged in accordance with the conductive pads 202 of the circuit substrate 20 and are preferably made of soldering materials clad with gold, so as to ensure favorable performance of the electrical connection between the circuit substrate 20 and the cable 30. The conductive balls 302 are attached to the circuit substrate 20 via soldering or planting. A pair of through-holes 304 in alignment with the posts 204 of the circuit substrate 20 is defined on the cable 30. The mating of the through-holes 304 and the posts 204 can facilitate accurate and convenient positioning of the cable 30 on the circuit substrate 20.

The cable 30 is uniformly disposed with a number of standoffs 308 thereon in an interval manner. Each of the standoffs 308 has a height slightly less than the diameter of the conductive ball 302, so as to prevent the conductive balls 302 from crashing due to improper compression of the elastic spring 50. In the present embodiment, the standoffs 308 are integrally formed with the cable 30. However, it should be understood that the standoffs 308 could also be provided by other ways. For instance, in another embodiment of the present invention, the standoffs 308 can also be integrally formed with the circuit substrate 20 or individually sandwiched between the cable 30 and the circuit substrate 20.

The electrically insulating slat 40 defines a substantially planar bottom surface resisting against an upper surface of the cable 30, to evenly transmit securing force of the elastics spring 50 onto the cable 30. The electrically insulating slat 40 is preferably made from rubber with desirable rigidity. In another embodiment of the present invention, the electrically insulating slat 40 can also be a metal plate clad with electrically insulating material, such as resin or the like.

As illustrated in FIG. 1, the elastic spring 50 is made from material having favorable flexibility. Two opposite ends of the elastic spring 50 are constructed to slightly bend upwardly so as to clasp the hooks 60 and exert a securing force on the electrically insulating slat 40.

It should be understood that the elastic spring 50 can also be made from other materials. For example, in an alternative form of the present invention, the elastic spring 50 is made from electrically insulating material with desirable flexibility and rigidity. The elastic spring 50 is also configured to have a substantially planar bottom surface. In this case, there is no need to set the electrically insulating slat 40 between the elastic spring 50 and the cable 30 to transmit the securing force of the elastic spring 50 onto the cable 30.

Assembly of the electrical connection 10 will now be described in greater detail. As illustrated in FIGS. 1 to 6, the cable 30 is positioned on the circuit substrate 20 via the mating of the through-hole 304 thereof and the posts 204 of the circuit substrate 20. The conductive balls 302 are properly registered with the corresponding conductive pads 202 on the circuit substrate 20, respectively. The electrically insulating slat 40 is placed on the cable 30 with an inner edge thereof being in alignment with an inner edge of the cable 30. The elastic spring 50 is seated on the electrically insulating slat 40. A pair of hooks 60 is set in the notches 206, respectively, to clasp the two ends of the elastic spring 50 and firmly secure the cable 30 to the circuit substrate 20.

In connection with the above described assembling process, the cable 30 can be accurately and conveniently assembled to the circuit substrate 20. In other words, the embodiment of the present invention provides a comparatively simple way for attaching a cable 30 to a circuit substrate 20, which may simplify the manufacturing process and facilitate the assembly and disassembly of the cable 30.

It should be understood that the cable 30 can also be secured to the circuit substrate 20 via other securing means. For instance, in an alternative-form of the present invention, a pair of board-locks is provided to secure two opposite ends of the cable 30 to the circuit substrate 20. This way, the cable 30 can also be secured to the circuit substrate 20. In still another form of the present invention, the cable 30 with a number of soldering balls attached thereto is coupled to the circuit substrate 20 via reflowing process. In this case, there is no need to use the elastic spring 50 and the hooks 60 to attach the cable 30 to the circuit substrate 20.

While the present invention has been illustrated by description of embodiments thereof, and while the embodiments have been described in considerable detail, it is not intended to restrict or in any way limit the scope of the appended claims to such details. Additional advantages and modifications in the spirit and scope of the present invention will readily appear to one skilled in the art. Therefore, the present invention is not limited to the specific details and illustrative examples shown and described.

What is claimed is:

1. An electrical interconnection comprising: a circuit substrate having a plurality of conductive pads arranged in a predetermined fashion; and a cable having a plurality of circuit traces each embedded in an electrically insulating jacket and having a mass of conductor in accordance with a conductive pad of the circuit substrate, the cable being coupled to the circuit substrate with each mass of solder being securely and electrically registered with a corresponding conductive pad of the circuit substrate;

wherein the cable is coupled to the circuit substrate by fastening two ends of an electrically insulating elastic spring to a pair of notches correspondingly defined in the circuit substrate via a pair of hooks:

wherein a slat having a substantially insulating planar bottom surface abutting against the cable is sandwiched between the elastic spring and the cable; wherein a plurality of standoffs is provided between the cable and the circuit substrate; the cable is coupled to the circuit substrate by reflowing the mass of solder to a corresponding conductive pad on the circuit substrate.

2. The electrical interconnection of claim 1, wherein the conductor is solder.

3. The electrical interconnection of claim 1, wherein the circuit substrate is formed with a pair of posts and the cable is correspondingly provided with a pair of through-holes to mate with the posts.

4. The electrical interconnection of claim 1, wherein the slat is made of metal clad with rubber.

* * * * *